(12) United States Patent
Park et al.

(10) Patent No.: US 7,556,998 B2
(45) Date of Patent: Jul. 7, 2009

(54) METHOD OF MANUFACTURING SEMICONDUCTOR DEVICES

(75) Inventors: Hyuk Park, Choongcheongbuk-do (KR); Dong Yeol Keum, Icheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 439 days.

(21) Appl. No.: 11/319,489

(22) Filed: Dec. 29, 2005

(65) Prior Publication Data

US 2006/0148152 A1    Jul. 6, 2006

(30) Foreign Application Priority Data

Dec. 30, 2004    (KR) .................. 10-2004-0117035

(51) Int. Cl.
*H01L 21/8238* (2006.01)

(52) U.S. Cl. ................. 438/200; 257/E21.637
(58) Field of Classification Search ................ 438/200, 438/529, 926; 257/E21.524, E21.637
See application file for complete search history.

(56) References Cited

U.S. PATENT DOCUMENTS 6,469,316 B1 * 10/2002 Bush et al. .................. 257/48

\* cited by examiner

*Primary Examiner*—Chandra Chaudhari
(74) *Attorney, Agent, or Firm*—McKenna Long & Aldridge LLP

(57) ABSTRACT

A method of manufacturing a semiconductor device including forming a dummy gate electrode which is divided into first and second areas, selectively implanting N-type ions and P-type ions into the first and second areas of the dummy gate electrode respectively and then implanting impurity ions into a boundary region between the first area and second area of the dummy gate electrode.

4 Claims, 10 Drawing Sheets

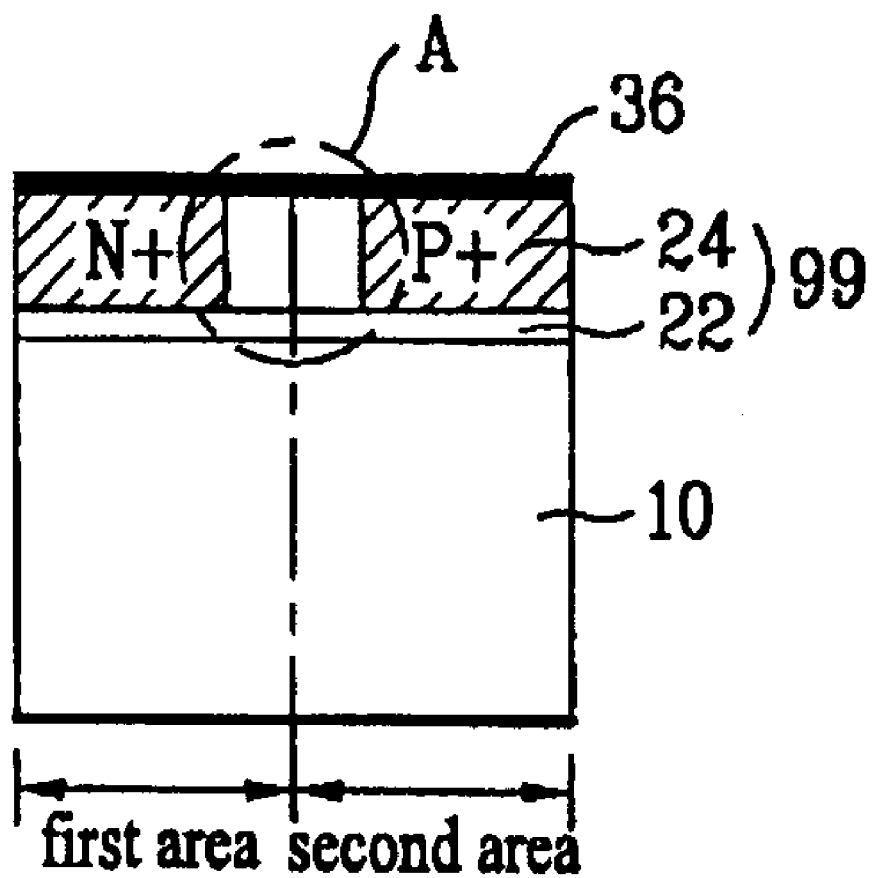

METHOD OF MANUFACTURING SEMICONDUCTOR DEVICES

CROSS REFERENCE TO RELATED APPLICATIONS

This application claims the benefit of Korean Patent Application No. P2004-0117035, filed Dec. 30, 2004, which is hereby incorporated by reference for all purposes as if fully set forth herein.

BACKGROUND OF THE INVENTION

1. Field of the Invention

The present invention relates to a semiconductor device and more particularly to a method of manufacturing a semiconductor device in which a butting region can be removed by implanting additional ions into the butting region generated at the boundary between a first area and a second area of a dummy gate electrode.

2. Description of the Related Art

Semiconductor devices such as MOS (Metal Oxide Semiconductor) transistors are a kind of field effect transistors (FET). In MOS transistors, a gate oxide layer and a gate electrode are formed on a semiconductor substrate made of silicon, and source and drain regions are formed in the semiconductor substrate on both sides of the gate electrode. LDD (Lightly Doped Drain) regions with a relatively low concentration are formed inside the source and drain regions.

MOS transistors are classified into N-channel MOS transistors and P-channel MOS transistors based on the conductivity type of the channel. When MOS transistors having both channel types are formed on a single semiconductor substrate, they are referred to as CMOS (Complementary Metal Oxide Semiconductor) transistors.

A typical method of manufacturing a CMOS semiconductor device is described in detail below with reference to the accompanying drawings.

FIGS. 1A to 1I are cross-sectional views illustrating process steps of a conventional method of manufacturing a CMOS semiconductor device.

FIGS. 1A to 1I show an NMOS area and a test area. Since a PMOS area is formed by the use of the same processes as the NMOS area, the PMOS area is omitted from the figures.

First, as shown in FIG. 1A, a semiconductor substrate 10, in which an NMOS area, a PMOS area, an inactive area, and a test area are defined, is prepared. A pad oxide layer 12 and a pad nitride layer 14, which are used for performing an isolation process (ISO) as a subsequent process, are sequentially formed on the entire surface of the semiconductor substrate 10.

Subsequently, as shown in FIG. 1B, a photoresist is deposited on the entire surface of the semiconductor substrate 10 including the pad oxide layer 12 and the pad nitride layer 14 and an exposure process using the photoresist as a mask is performed thereto, thereby forming a first photoresist pattern PR1. Thereafter, a shallow trench isolation (STI) process using the first photoresist pattern PR1 as an isolation (ISO) mask is performed, thereby forming an element isolating layer 18 in the inactive area of the semiconductor substrate 10.

As shown in FIG. 1C, the first photoresist pattern PR1 is removed by performing a stripping process and the pad nitride layer 14 and the pad oxide layer 12 are sequentially removed by performing a cleaning process.

Subsequently, a well region 20 is selectively formed in the NMOS area of the semiconductor substrate 10 by performing a well-ion implantation process using a first well-ion implanting mask.

Thereafter, not shown in the figures, a well region is selectively formed in the PMOS area of the semiconductor substrate 10 by performing the well-ion implantation process using a second well-ion implanting mask. As a result, the well region 20 of the NMOS area is doped with P-type ions and the well region of the PMOS area is doped with N-type ions.

As shown in FIG. 1D, a gate oxide layer 22 is formed by performing a thermal oxidation process or a rapid thermal annealing process to the entire surface of the semiconductor substrate 10 in which the well region 20 is formed.

Subsequently, a polysilicon layer 24 for forming a gate electrode 26 is formed on the entire surface of the semiconductor substrate 10 on which the gate oxide layer 22 is formed.

As shown in FIG. 1E, the polysilicon layer 24 and the gate oxide layer 22 are sequentially etched by performing a photolithography and etching process using a gate-electrode pattern mask. As a result, gate electrodes 26 are formed in the NMOS area and the PMOS area and a dummy gate electrode 99 is formed in the test area. The dummy gate electrode 99 is divided into first and second areas. As shown, the second areas are positioned between the first areas.

The PMOS area and the second areas of the dummy gate electrode 99 are covered using a second photoresist pattern PR2 as a mask. By selectively performing an N-type ion implantation process with a low concentration to the active area of the NMOS area and the first areas of the dummy gate electrode 99, a low-concentration junction region 28 is formed in the NMOS area, and the first areas of the dummy gate electrode 99 are doped with N-type ions with a low concentration.

As shown in FIG. 1F, the NMOS area and the first areas of the dummy gate electrode 99 are covered using a third photoresist pattern PR3 as a mask. By selectively performing an P-type ion implantation process with a low concentration to the active area of the PMOS area and the second areas of the dummy gate electrode 99, a low-concentration junction region is formed in the PMOS area and the second areas of the dummy gate electrode 99 are doped with P-type ions with a low concentration, Subsequently, as shown in FIG. 1G, HLD (High temperature Low pressure Dielectric) spacers 30 are formed on the sidewalls of the gate electrodes 26 of the NMOS area and the PMOS area, by sequentially performing a deposition process and an etching process.

Thereafter, the PMOS area and the second areas of the dummy gate electrode 99 are covered using a fourth photoresist pattern PR4 as a mask and a part of the low-concentration junction region 28 of the NMOS area is covered using the spacers 30 as a mask. By selectively performing an N-type ion implantation process with a high concentration to the active area of the NMOS area and the first areas of the dummy gate electrode 99, a high-concentration junction region 32 is formed in the NMOS area and the first areas of the dummy gate electrode 99 are doped with N-type ions with a high concentration.

Next, as shown in FIG. 1H, the NMOS area and the first areas of the dummy gate electrode 99 are covered using a fifth photoresist pattern PR5 as a mask and a part of the low-concentration junction region of the PMOS area is covered using the spacers as a mask. By selectively performing a P-type ion implantation process with a high concentration to the active area of the PMOS area and the second areas of the dummy gate electrode 99, a high-concentration junction region is formed in the PMOS area and the second areas of the dummy gate electrode 99 are doped with P-type ions with a high concentration.

As a result, the gate electrode 26 of the NMOS area is doped with N-type ions with a high concentration and the gate electrode of the PMOS area is doped with P-type ions with a high concentration.

Source and drain regions 34 including the low-concentration junction region 28 and the high concentration junction region 32 are formed in the NMOS area and the PMOS area, respectively.

The first areas of the dummy gate electrode 99 are doped with N-type ions with a high concentration and the second areas thereof are doped with P-type ions with a high concentration.

Subsequently, as shown in FIG. 1I, a salicide (Self Aligned Silicide) layer 36 is formed on the high-concentration junction regions 32 of the NMOS and PMOS areas, the gate electrodes 26, and the dummy gate electrode 99.

The semiconductor device formed in this way has the following problems.

FIG. 2 is a diagram illustrating a butting region of a conventional dummy gate electrode.

The salicide layer 36 formed on the gate electrode 26 is an ohmic contact layer and serves to reduce difference in resistance between the gate electrodes 26 and other electrodes when the gate electrodes 26 are connected to the other electrodes. Before the gate electrodes 26 are connected to the other electrodes through the salicide layer, the resistance of the salicide layer 36 must be measured after the salicide layer 36 is formed on the gate electrode 26.

It is possible to measure the resistance of the salicide 36 over the gate electrode 26 by measuring the resistance of the salicide layer 36 formed on the dummy gate electrode 99 in the test area. By measuring the resistance of the salicide layer 36 in the test area, the resistance of the salicide layer 36 formed on the gate electrodes 26 can be indirectly obtained.

When the mask is not accurately aligned on the first areas and the second areas of the dummy gate electrode 99, as shown in FIG. 2, butting regions A, which are not doped with ions, may be formed in the boundaries between the first areas and the second areas.

When the butting regions A are generated in the dummy gate electrode 99, the resistance of the salicide layer 36 formed on the dummy gate electrode 99 varies. Therefore, the resistance of the salicide layer 36 over the gate electrode cannot be accurately measured.

SUMMARY OF THE INVENTION

Accordingly, the present invention is directed to a method of manufacturing a semiconductor device that substantially obviates one or more problems due to limitations and disadvantages of the related art.

An advantage of the present invention is that it can provide a method of manufacturing a semiconductor device in which it is possible to prevent a butting region from being generated in the dummy gate electrode by selectively implanting ions into the boundary region between a first area and a second area of a dummy gate electrode.

Additional features and advantages of the present invention will be set forth in the description which follows, and in part it will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described, a method of manufacturing a semiconductor device comprises: preparing a semiconductor substrate in which an NMOS area, a PMOS are, an inactive area, and a test area are defined; forming an element isolating layer in the inactive area of the semiconductor substrate; forming a gate electrode in the active area of the NMOS area and the active area of the PMOS area and forming a dummy gate electrode, which is made of the same material as the gate electrode and which is divided into first and second areas, in the test area; selectively implanting N-type ions with a low concentration into a low-concentration junction region of the NMOS area and the first area of the dummy gate electrode; selectively implanting P-type ions with a low concentration into a low-concentration junction region of the PMOS area and the second area of the dummy gate electrode; selectively implanting N-type ions with a high concentration into the low-concentration junction region of the NMOS region and the first area of the dummy gate electrode; selectively implanting P-type ions with a high concentration into the low-concentration junction region of the PMOS region and the second area of the dummy gate electrode; and implanting impurity ions into a boundary region between the first area and the second area of the dummy gate electrode.

Here, N-type ions with a high concentration may be implanted into the boundary region between the first area and the second area of the dummy gate electrode.

Alternatively, P-type ions with a high concentration may be implanted into the boundary region between the first area and the second area of the dummy gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention.

In the drawings:

FIG. 2 is a diagram illustrating a butting region of a conventional dummy gate electrode.

DETAILED DESCRIPTION OF THE EMBODIMENTS

Reference will now be made in detail to exemplary embodiments of the present invention, examples of which are illustrated in the accompanying drawings.

FIGS. 3A to 3J are cross-sectional views illustrating process steps of the method of manufacturing a semiconductor device according to an embodiment of the present invention.

Only an NMOS area and a test area are shown in FIGS. 3A to 3J. Since a PMOS area is formed through the use of the same processes as the NMOS area, the PMOS area is omitted from the figures.

Figure 1A:
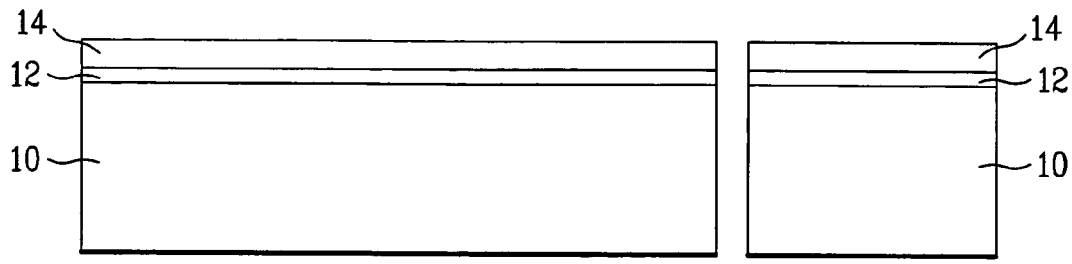
FIGS. 1A to 1I are cross-sectional views illustrating process steps of a conventional method of manufacturing a CMOS semiconductor device.
Figure 1B:
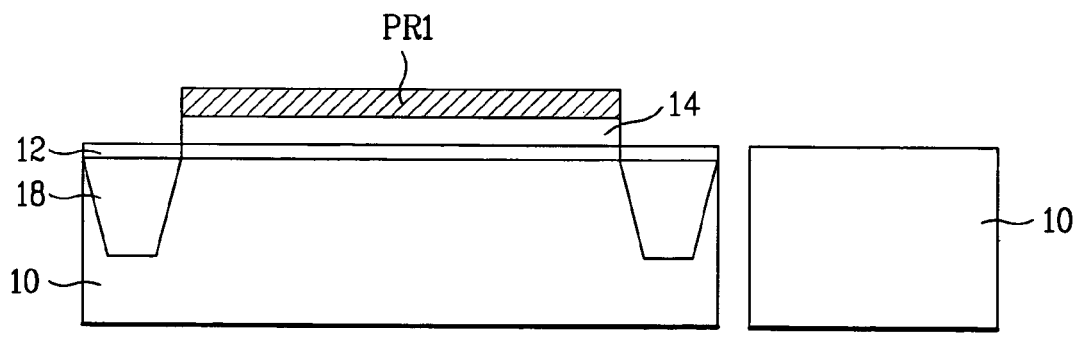
Figure 1C:
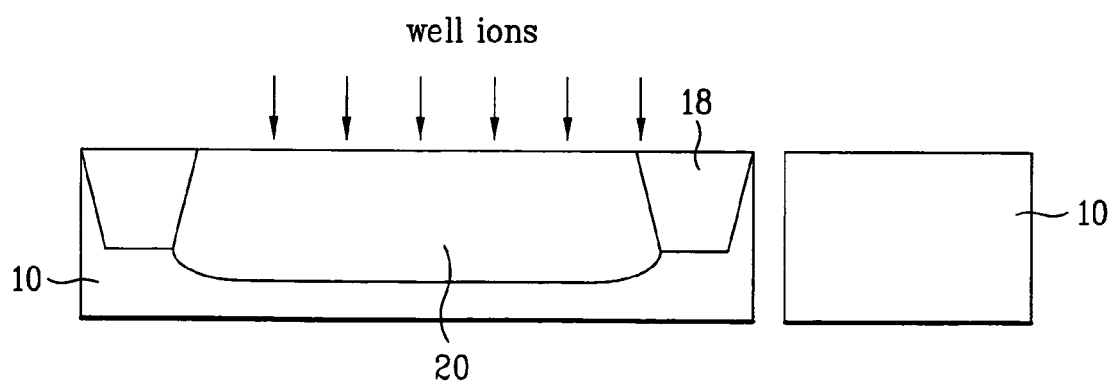
Figure 1D:
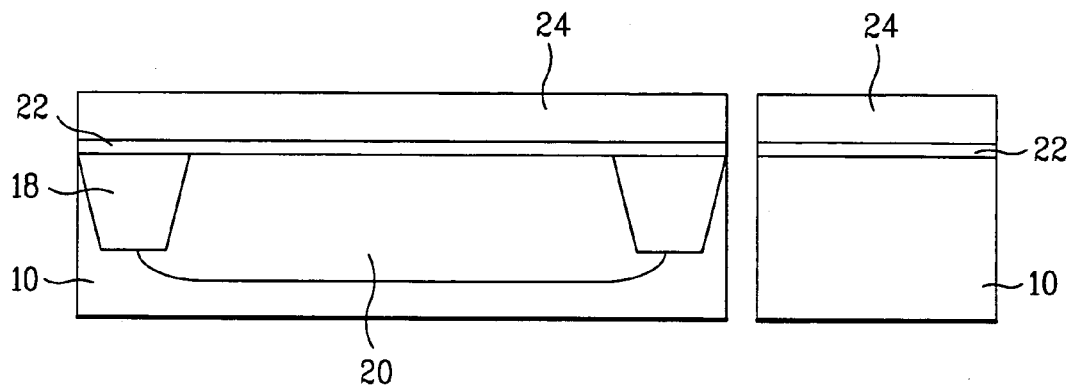
Figure 1E:
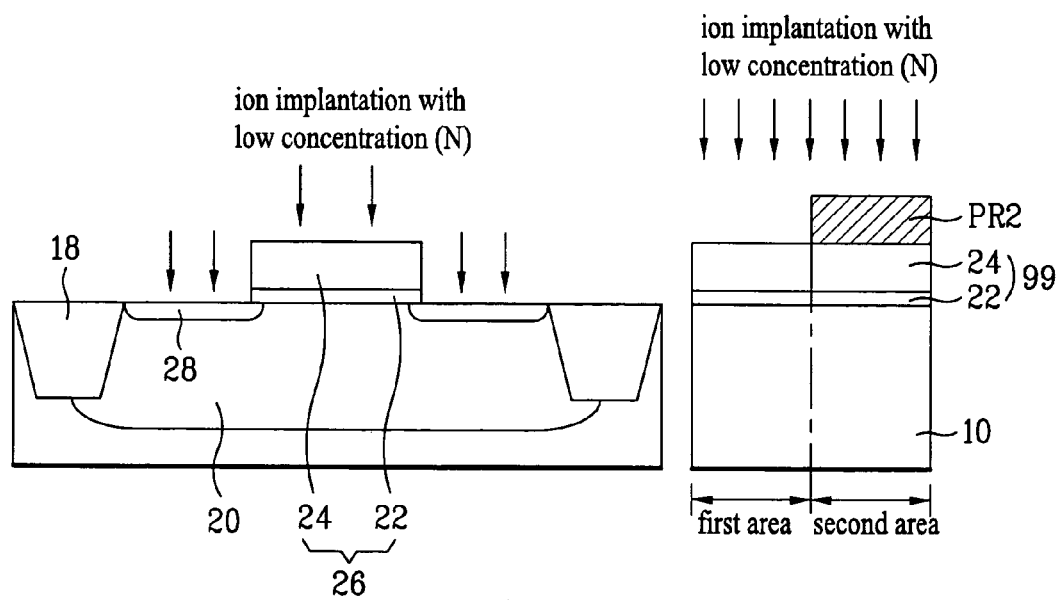
Figure 1F:
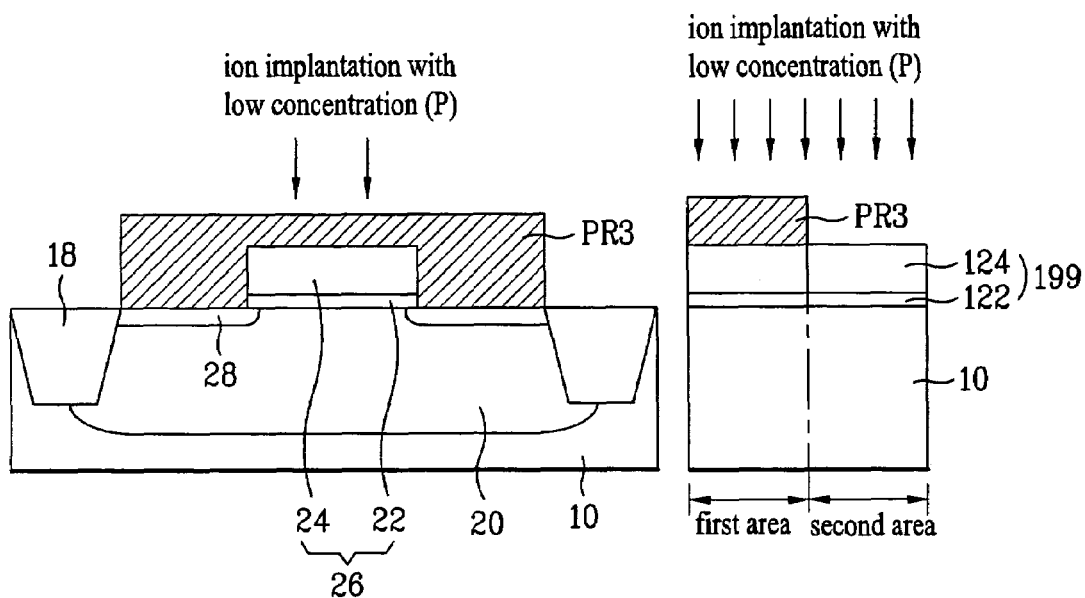
Figure 1G:
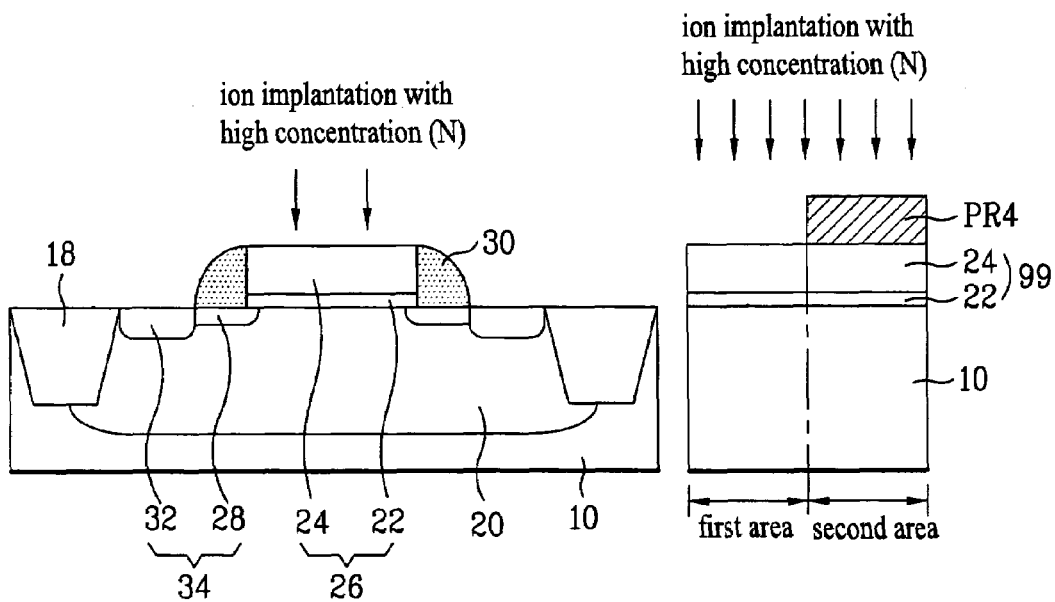
Figure 1H:
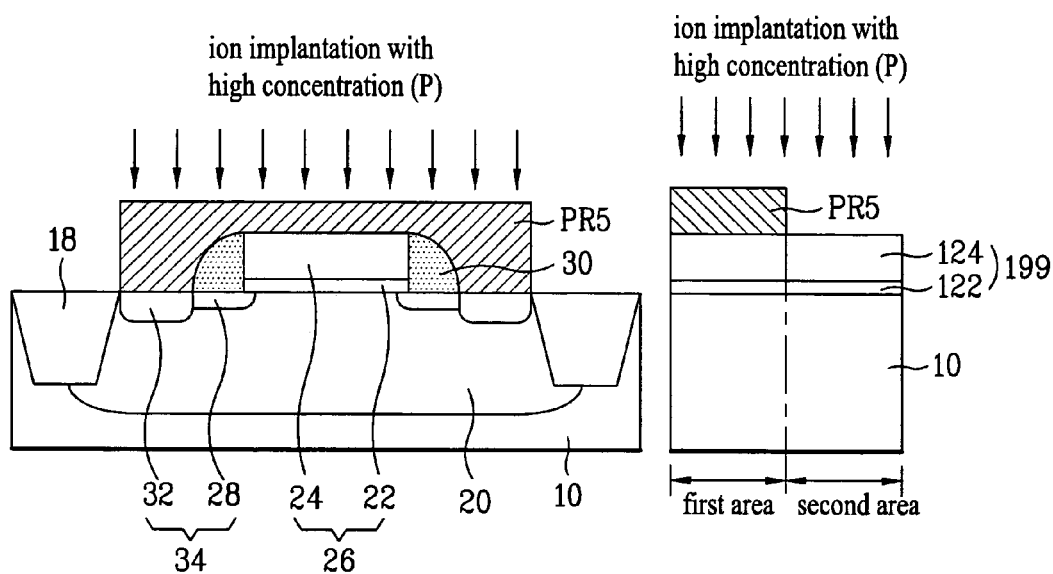
Figure 1I:
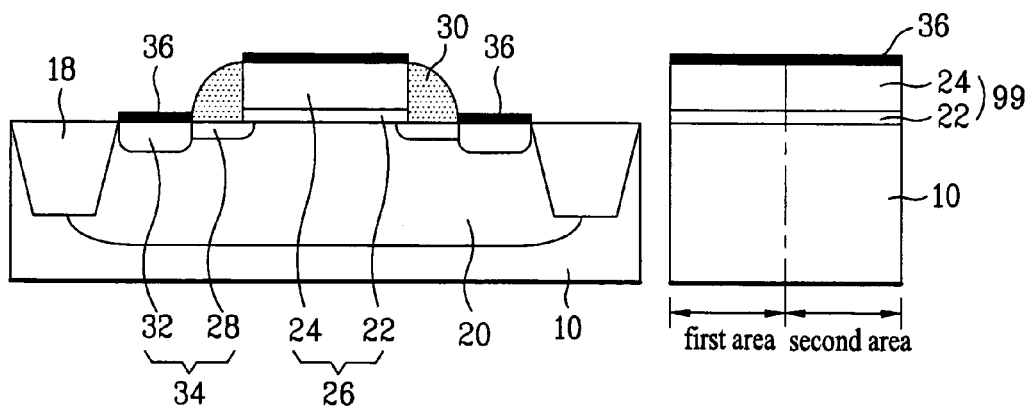
Figure 3A:
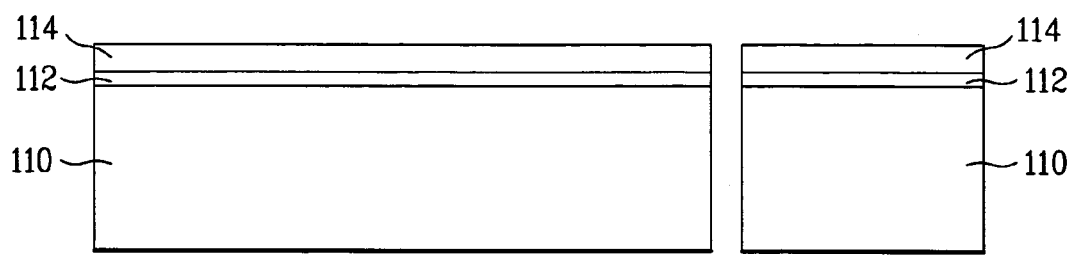
FIGS. 3A to 3J are cross-sectional views illustrating process steps of a method of manufacturing a semiconductor device according to an embodiment of the present invention.

As shown in FIG. 3A, a semiconductor substrate 110 in which an NMOS area, a PMOS area, an inactive area, and a test area are defined is prepared. A pad oxide layer 112 and a pad nitride layer 114, which are used for performing an isolation (ISO) process as a subsequent process, are sequentially formed on the entire surface of the semiconductor substrate 110.

Figure 3B:
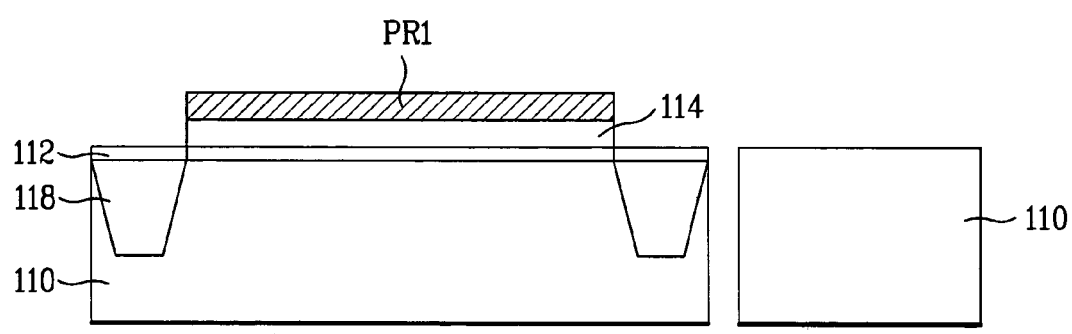

As shown in FIG. 3B, a photoresist is deposited on the entire surface of the semiconductor substrate 110 including the pad oxide layer 112 and the pad nitride layer 114 and an exposure process using the photoresist as a mask is performed thereto, thereby forming a first photoresist pattern PR1. Thereafter, a shallow trench isolation (STI) process using the first photoresist pattern PR1 as an isolation (ISO) mask is performed, thereby forming an element isolating layer 118 in the inactive area of the semiconductor substrate 110.

Figure 3C:
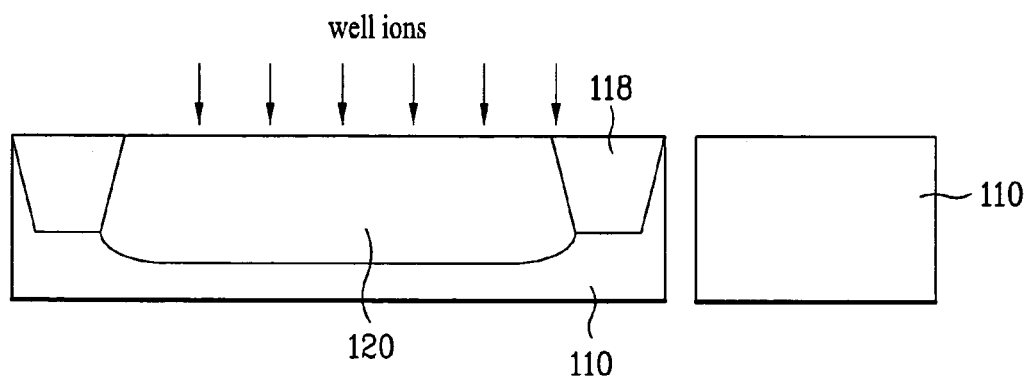

As shown in FIG. 3C, the first photoresist pattern PR1 is then removed by performing a stripping process, also the pad nitride layer 114 and the pad oxide layer 112 are sequentially removed by performing a cleaning process.

A well region 120 is then selectively formed in the NMOS area of the semiconductor substrate 110 by performing a well-ion implantation process using a first well-ion implanting mask.

Thereafter, not shown in the figures, a well region is selectively formed in the PMOS area of the semiconductor substrate 110 by performing the well-ion implantation process using a second well-ion implanting mask. As a result, the well region 120 of the NMOS area is doped with P-type ions and the well region of the PMOS area is doped with N-type ions.

Figure 3D:
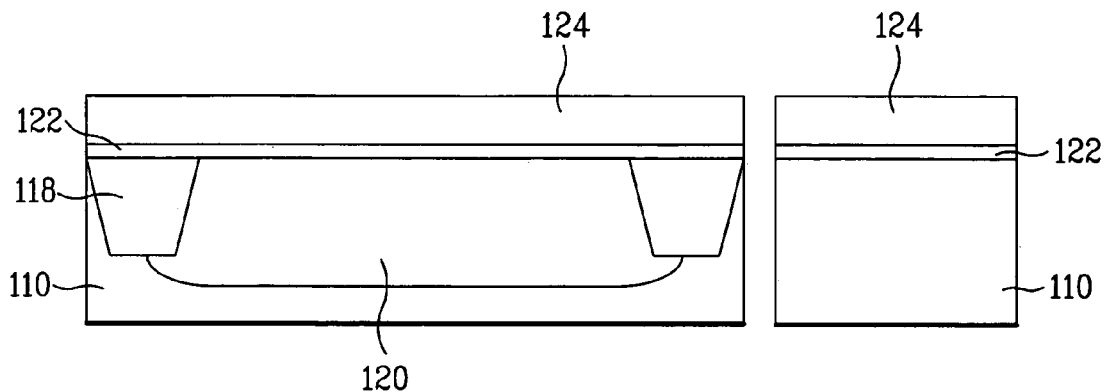

As shown in FIG. 3D, a gate oxide layer 122 is formed by performing a thermal oxidation process or a rapid thermal annealing process to the entire surface of the semiconductor substrate 110 in which the well region 120 is formed.

Subsequently, a polysilicon layer 124, for forming a gate electrode 26, is formed on the entire surface of the semiconductor substrate 110 on which the gate oxide layer 122 is formed.

Figure 3E:
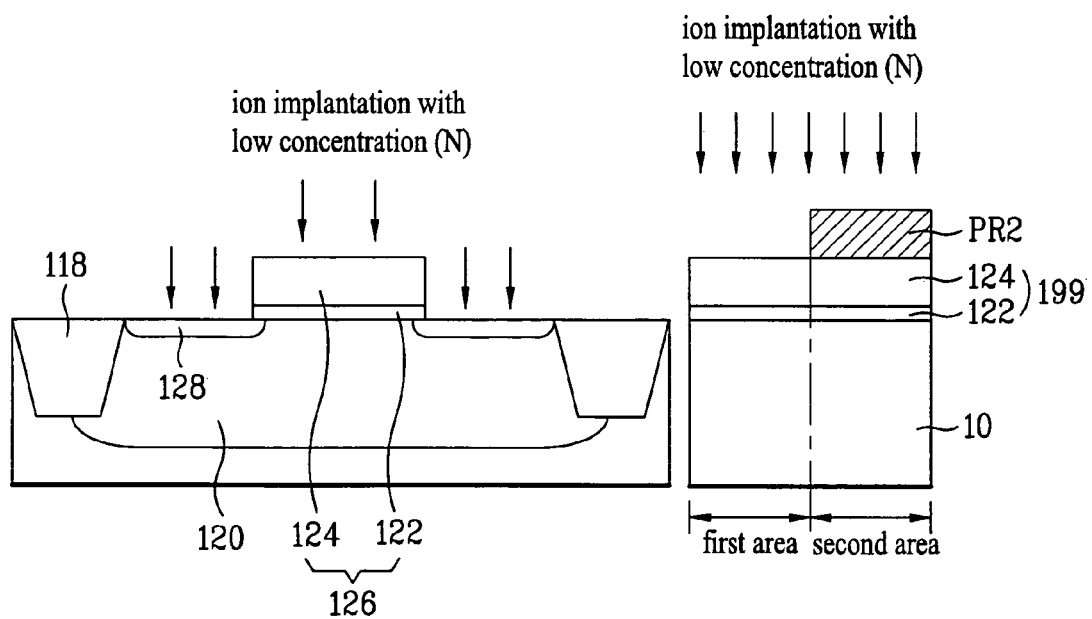

As shown in FIG. 3E, the polysilicon layer 124 and the gate oxide layer 122 are sequentially etched by performing a photolithography and etching process using a gate-electrode pattern mask. As a result, gate electrodes 126 are formed in the NMOS area and the PMOS area and a dummy gate electrode 199 is formed in the test area. Here, the dummy gate electrode 199 is divided into first and second areas with the second areas being positioned between the first areas.

The PMOS area and the second areas of the dummy gate electrode 199 are then covered using a second photoresist pattern PR2 as a mask. By selectively performing an N-type ion implantation process with a low concentration to the active area of the NMOS area and the first areas of the dummy gate electrode 199, a low-concentration junction region 128 is then formed in the NMOS area and the first areas of the dummy gate electrode 199 are doped with N-type ions with a low concentration.

Figure 3F:
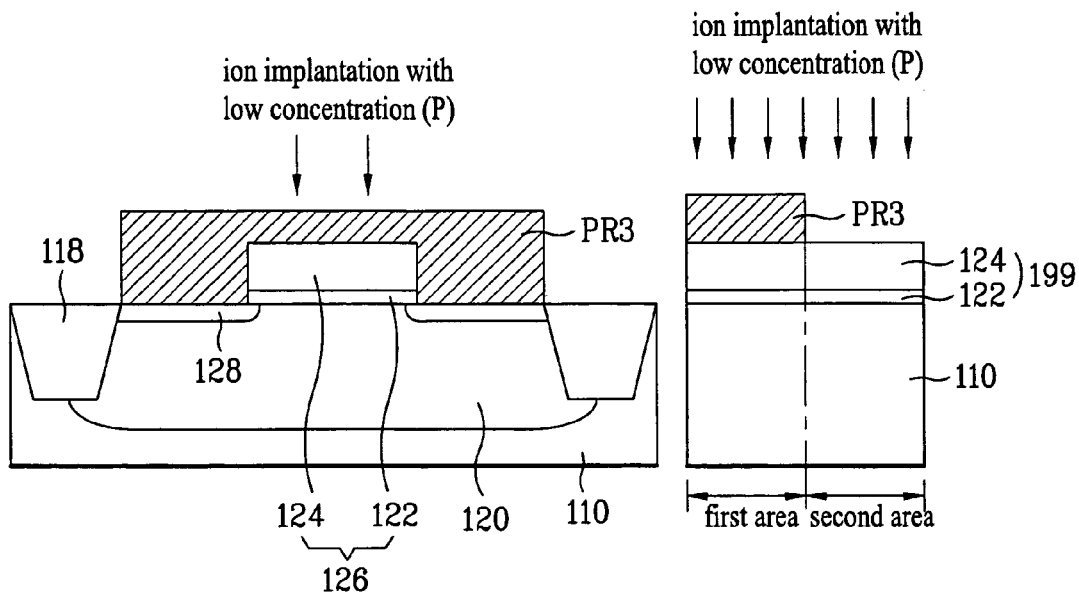

Next, as shown in FIG. 3F, the NMOS area and the first areas of the dummy gate electrode 199 are covered using a third photoresist pattern PR3 as a mask. By selectively performing an P-type ion implantation process with a low concentration to the active area of the PMOS area and the second areas of the dummy gate electrode 199, a low-concentration junction region 128 is then formed in the PMOS area and the second areas of the dummy gate electrode 199 are doped with P-type ions with a low concentration.

Figure 3G:
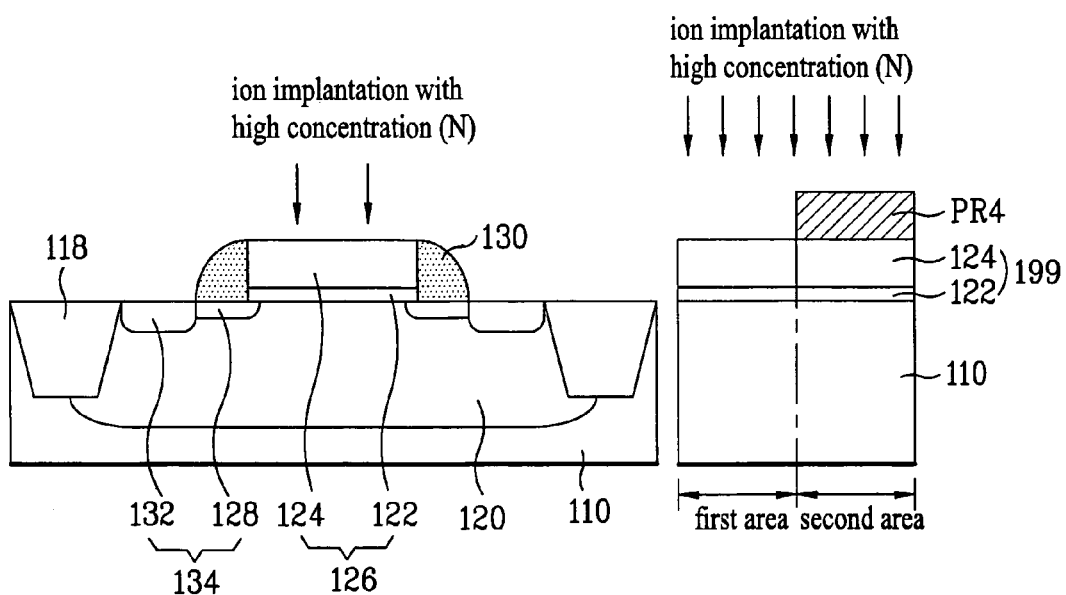

As shown in FIG. 3G, HLD (High temperature Low pressure Dielectric) spacers 130 are formed on the sidewalls of the gate electrodes 126 in the NMOS area and the PMOS area by sequentially performing a deposition process and an etching process.

The PMOS area and the second areas of the dummy gate electrode 199 are then covered using a fourth photoresist pattern PR4 as a mask and a part of the low-concentration junction region 128 of the NMOS area is covered using the spacers 130 as a mask. By selectively performing an N-type ion implantation process with a high concentration to the active area of the NMOS area and the first areas of the dummy gate electrode 199, a high-concentration junction region 132 is then formed in the NMOS area and the first areas of the dummy gate electrode 199 are doped with N-type ions with a high concentration.

Figure 3H:
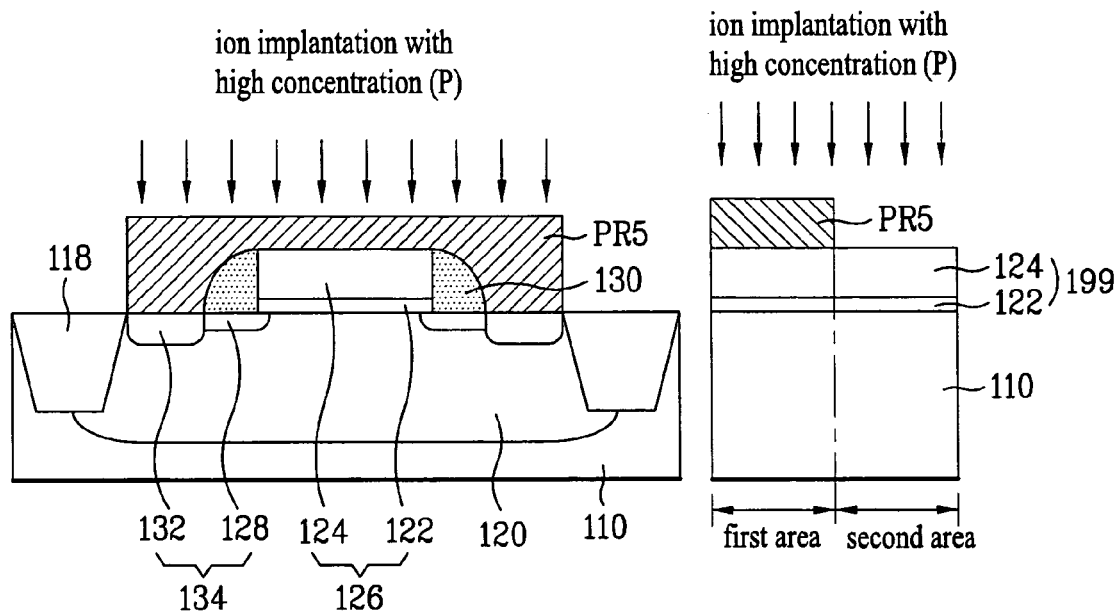

Next, as shown in FIG. 3H, the NMOS area and the first areas of the dummy gate electrode 199 are covered using a fifth photoresist pattern PR5 as a mask and a part of the low-concentration junction region of the PMOS area is covered using the spacers as a mask. By selectively performing a P-type ion implantation process with a high concentration to the active area of the PMOS area and the second areas of the dummy gate electrode 199, a high-concentration junction region is then formed in the PMOS area and the second areas of the dummy gate electrode 199 are doped with P-type ions with a high concentration.

As a result, the gate electrode 126 of the NMOS area is doped with N-type ions with a high concentration and the gate electrode of the PMOS area is doped with P-type ions with a high concentration.

Source and drain regions 134 including the low-concentration junction region 128 and the high concentration junction region 132 are formed in the NMOS area and the PMOS area, respectively.

Figure 3I:
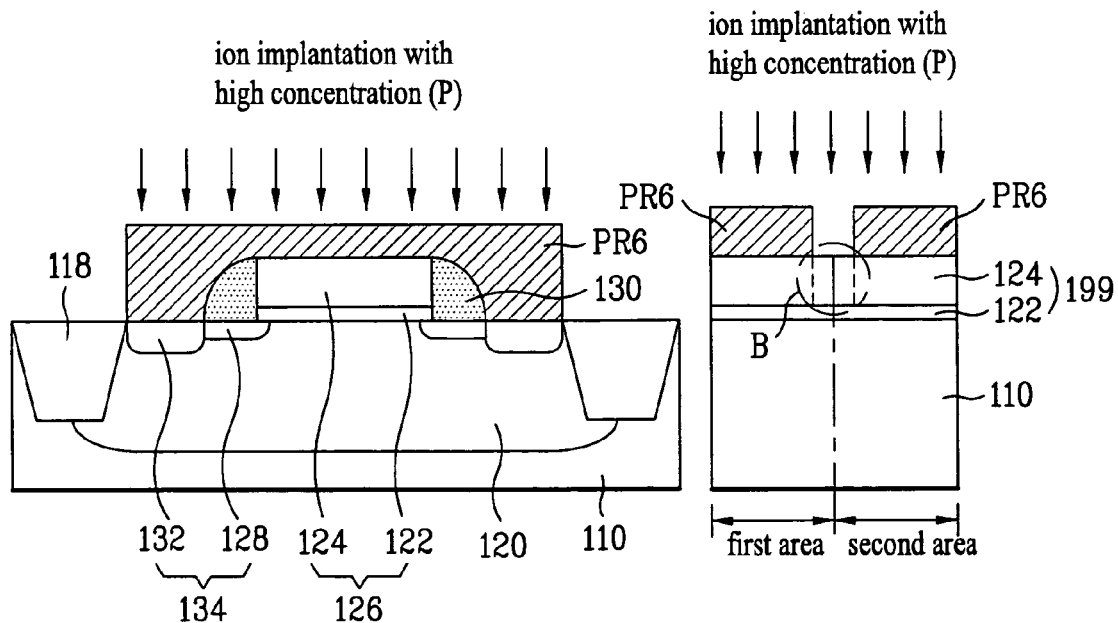

As shown in FIG. 3I, the NMOS area, the PMOS area, and portions of the dummy gate electrode 199 other than the boundary regions B between the first areas and the second areas of the dummy gate electrode 199 are covered using a sixth photoresist pattern PR6 as a mask. By performing selectively a P-type ion implantation process with a high concentration only to the boundary regions B between the first areas and the second areas of the dummy gate electrode 199, the boundary regions B are thereby doped with P-type ions with a high concentration.

As a result, the whole dummy gate electrode 199 is doped with N-type or P-type ions with a high concentration. Accordingly, the butting regions which were problematic may be removed.

In another embodiment, the boundary regions B may be doped with N-type ions with a high concentration, by implanting N-type ions with a high concentration into the boundary regions B.

Figure 3J:
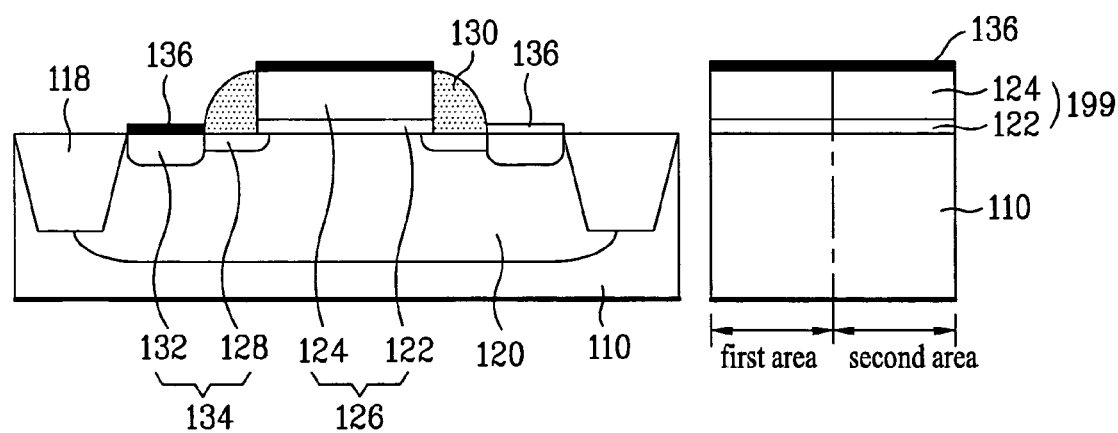

As shown in FIG. 3J, a salicide (Self Aligned Silicide) layer 136 is then formed on the high-concentration junction regions 132 of the NMOS and PMOS areas, the gate electrodes 126, and the dummy gate electrode 199.

As described above, the semiconductor device and the method of manufacturing the semiconductor device according to the present invention have many advantages.

Since the butting regions may be removed by implanting additional ions into the butting regions at the boundaries between the first areas and the second areas of the dummy gate electrode, it is possible to prevent variation in resistance of the salicide layer formed on the dummy gate electrode.

Therefore, it may be possible to accurately measure the resistance of the salicide layer formed on the dummy gate electrode.

It will be apparent to those skilled in the art that various modifications and variations can be made in the present invention without deporting from the spirit or scope of the invention. Thus, it is intended that the present invention cover the modifications and variations of this invention provided they come within the scope of the appended claims and their equivalents.

What is claimed is:

1. A method of manufacturing a semiconductor device, the method comprising:
   preparing a semiconductor substrate in which an NMOS area, a PMOS area, an inactive area, and a test area are defined;
   forming an element isolating layer in the inactive area of the semiconductor substrate;
   forming a gate electrode in the active area of the NMOS area and the active area of the PMOS area; and
   forming a dummy gate electrode, which is made of the same material as the gate electrode and which is divided into a plurality of first areas and second areas, in the test area;
   selectively implanting N-type ions with a low concentration into a low-concentration junction region of the NMOS area and the plurality of first areas of the dummy gate electrode;
   selectively implanting P-type ions with a low concentration into a low-concentration junction region of the PMOS area and the plurality of second areas of the dummy gate electrode;
   selectively implanting N-type ions with a high concentration into the low-concentration junction region of the NMOS region and the plurality of first areas of the dummy gate electrode;
   selectively implanting P-type ions with a high concentration into the low-concentration junction region of the PMOS region and the plurality of second areas of the dummy gate electrode; and
   implanting impurity ions into a boundary region between the plurality of first areas and the plurality of second areas of the dummy gate electrode.

2. The method according to claim 1, wherein N-type ions with a high concentration are implanted into the boundary region between the plurality of first areas and the plurality of second areas of the dummy gate electrode.

3. The method according to claim 1, wherein P-type ions with a high concentration are implanted into the boundary region between the plurality of first areas and the plurality of second areas of the dummy gate electrode.

4. The method according to claim 1, further comprising forming a salicide over the dummy gate.

* * * * *